United States Patent [19]

Feldstein

[11] 4,301,190
[45] Nov. 17, 1981

[54] PRETREATMENT WITH COMPLEXING AGENT IN PROCESS FOR ELECTROLESS PLATING

[76] Inventor: Nathan Feldstein, 63 Hemlock Cir., Princeton, N.J. 08540

[21] Appl. No.: 61,484

[22] Filed: Jul. 27, 1979

Related U.S. Application Data

[60] Continuation-in-part of Ser. No. 934,344, Aug. 17, 1978, Pat. No. 4,220,678, which is a division of Ser. No. 830,456, Sep. 6, 1977, abandoned, which is a division of Ser. No. 731,212, Oct. 12, 1976, Pat. No. 4,136,216, which is a division of Ser. No. 607,506, Aug. 26, 1975, Pat. No. 3,993,799, which is a continuation-in-part of Ser. No. 512,224, Oct. 4, 1974, abandoned, and a continuation-in-part of Ser. No. 672,046, Mar. 30, 1976, which is a division of Ser. No. 521,901, Nov. 8, 1974, Pat. No. 3,993,491, which is a continuation of Ser. No. 422,774, Dec. 7, 1973, abandoned, and a continuation-in-part of Ser. No. 672,045, Mar. 30, 1976, Pat. No. 4,239,538, which is a division of Ser. No. 550,435, Feb. 18, 1975, Pat. No. 3,993,848.

[51] Int. Cl.³ .............................................. C23C 3/02
[52] U.S. Cl. ........................................ 427/97; 427/98; 427/304; 427/305; 427/306
[58] Field of Search ............................... 427/304–306, 427/98, 97; 106/1.11

[56] References Cited

U.S. PATENT DOCUMENTS

| | | | |
|---|---|---|---|
| 3,563,784 | 2/1971 | Innes et al. | 427/306 |
| 3,657,003 | 4/1972 | Kenney | 106/1.18 |
| 3,666,527 | 5/1972 | Feldstein et al. | 427/306 |
| 3,958,048 | 5/1976 | Donovan et al. | 427/306 |
| 3,993,491 | 11/1976 | Feldstein | 106/1.11 |
| 3,993,848 | 11/1976 | Feldstein | 427/306 |
| 4,082,899 | 4/1978 | Feldstein | 427/306 |
| 4,087,586 | 5/1978 | Feldstein | 427/304 |
| 4,136,216 | 1/1979 | Feldstein | 427/306 |

*Primary Examiner*—John D. Smith

[57] ABSTRACT

Metallic surfaces are imparted to non-conductive or dielectric substrate by an electroless (chemical) coating process comprised contacting said substrate with a composition comprising an adsorption modifier and thereafter coating the surface of the substrate with colloids of catalytic non-precious metals wherein the metals are either part of an alloy or in the elemental state or a compound.

27 Claims, No Drawings

PRETREATMENT WITH COMPLEXING AGENT IN PROCESS FOR ELECTROLESS PLATING

REFERENCE TO PRIOR APPLICATION

This application is a continuation-in-part of U.S. application Ser. No. 934,344 filed Aug. 17, 1978, now U.S. Pat. No. 4,220,678 which is a division of U.S. application Ser. No. 830,456 filed Sept. 6, 1977, abandoned, which is a division of U.S. application Ser. No. 731,212 filed Oct. 12, 1976, now U.S. Pat. No. 4,136,216, which is a divisional application of U.S. application Ser. No. 607,506, filed Aug. 26, 1975 now U.S. Pat. No. 3,993,799 which is a continuation-in-part of U.S. application Ser. No. 512,224 filed Oct. 4, 1974 now abandoned. In the alternative, this application may also be considered a continuation-in-part of U.S. application Ser. No. 672,046 filed Mar. 30, 1976 which is a division of U.S. application Ser. No. 521,901 filed Nov. 8, 1974 now U.S. Pat. No. 3,993,491 which is a continutation of U.S. application Ser. No. 422,774 filed Dec. 7, 1973 now abandoned. Also, this application may be considered as a continuation-in-part of U.S. application Ser. No. 672,045 filed Mar. 30, 1976 now U.S. Pat. No. 4,239,538 which is a division of U.S. application Ser. No. 550,435 filed on Feb. 18, 1975 now U.S. Pat. No. 3,993,848.

BACKGROUND OF THE INVENTION

Electroless or autocatalytic coating of dielectric surfaces is a well known process finding wide-spread utility in the preparation of such diverse articles as printed circuits, automotive trim, mirrors, etc.

Normal commercial electroless coating processes generally involve an initial cleaning and etching of the dielectric substrate by physical or chemical means to improve adherence of the metallic coating. The etched surface is then catalyzed by suitable catalytic compositions and processes to provide a surface capable of electroless plating initiation. In the prior art, the catalytic treatment generally encompassed the use of precious metals. More recently, compositions and processes utilizing non-precious metals have been disclosed suitable for electroless plating of dielectrics. U.S. Pat. Nos. 3,993,491, 3,993,799, 3,958,048, 3,993,801, 3,993,848, 4,048,354, 4,082,899, 4,087,586, 4,131,699, 4,136,216, 4,132,832, 4,150,171, 4,151,311 and applications Ser. No. 941,044 now U.S. Pat. No. 4,180,600, 803,777 now U.S. Pat. No. 4,181,760, 661,663, 893,248 now U.S. Pat. No. 4,167,596, 934,344 now allowed, 817,242 now U.S. Pat. No. 4,181,759, 938,438 now abandoned and 938,890 which are included herein by reference disclose the prior art as well as the recent advancements in which non-precious metals have been reported. Of these it should be noted that in U.S. Pat. No. 3,993,491 (Example 31) a prewet solution was used prior to the catalytic composition which was found particularly useful in through-hole plating of copper laminate, especially after the persulfate etch step. Specifically, using the prewet step has insured a greater adsorption of the catalytic composition onto the laminate surface. This modification nullifies the deterioration in adsorption (and/or absorption) characteristics resulting from the etch step. Also, in U.S. Pat. No. 3,993,848 the use of a linking agent is shown which can be made operative in either of two basic modes, but in each case it permits a greater adsorption of the active catalytic component(s) present within the catalytic composition. U.S. Pat. No. 4,087,586 demonstrates the use of colloids based upon insoluble compounds of non-precious metals and particularly those of copper, nickel, cobalt and iron.

It is also recognized that at least certain of the primer compositions in U.S. Pat. Nos. 3,993,491 and 3,993,848 are in reality of a colloidal nature. Specifically, those compositions which comprise of tin(IV) ions are expected to yield a colloidal nature due either to the insolubility of this ion or to its hydrolysis reaction to $\beta$-stannic acid. The copper(I) ions being part of a tin(II) complex are also affected by the adsorption characteristics of the tin(IV) and any colloid resulting thereof.

In reviewing the teachings disclosed in U.S. Pat. Nos. 3,993,799 and 3,958,048 it is evident that colloids of either hydrous oxides, metals (elemental state) and alloys (phosphides, borides, etc.) are useful in the catalytic treatment either as a two step or a single step activation treatment. Generally speaking, preferred non-noble metals in the above colloids are selected from the metals of copper, cobalt, nickel and iron and mixtures thereof, although as suggested in U.S. 3,993,799 other nonprecious metals may be used. It is recognized that it is generally desirable to have suspensions (dispersions) of very fine particulate matter for both stability (i.e., against precipitation), reactivity, and adhesion to the substrate. Accordingly, it is highly desirable to prepare such suspensions under conditions which would yield finely divided and highly stable colloids.

It was also recognized in U.S. Pat. No. 3,993,799 that those fine sized colloids of the metals and alloys due to their contact with water and/or air would react to provide a surface oxide and hence they were classified as hydrous oxide.

This type of problem has not been encountered in the prior art which has used precious metal colloids due to their inertness towards oxidation. It is recognized that if the surface of the colloids of metals or alloys is oxidized, the induction time would be prolonged when contacted with the electroless plating bath; this is true in particular whenever a single stage activation step is carried forth. Accordingly, it is highly desirable to provide means by which the formation of surface oxide for the metals or alloys is eliminated or minimized. The present invention provides compositions and processes which improve upon these disadvantages.

It is also well recognized in the art of electroless plating that for effective electroless plating onto catalytically treated non-conductors at least one of the following requirements must be met:

Case I: The catalytic surface may react chemically with the reducing agents present within the electroless plating bath. More than one chemical reaction may take place.

Case II: The catalytic surface may react chemically with the metallic ions present within the electroless plating bath in a galvanic type replacement reaction.

Case III: The catalytic surface may react at first with other chemical component(s) present within the electroless plating bath, e.g., complexing agent.

In Case I the chemical reactions may include chemical reduction of the catalytic components present on the dielectric, and/or decomposition of the reducing agent at the interface ultimately yielding hydrogen gas via an active reducing agent intermediate. In Case II to permit a galvanic replacement reaction it is recognized that some of the metal ions present in solutions must be more noble with respect to the metal and metal ions present on the treated non-conductor surface. Such relationship is well recognized from the EMF series. Thus, while metals like copper, cobalt, nickel and iron may be preferred as recognized in U.S. Pat. No. 3,993,799, other non-precious metals may also be of potential use (e.g., zinc, manganese, aluminum, etc.).

SUMMARY OF THE INVENTION

It is the principle object of the present invention to provide an effective and economical process for preparing dielectric substrates for electroless coating or plating of a metallic surface thereon, and to provide an electroless coating process including such preparation.

It is a particular object of the present invention to provide improved compositions through which the catalytic activity would be maintained for a longer duration. Other objectives of the present invention, if not specifically set forth herein, will be apparent to the skilled artisan upon the reading of the detailed description of the invention which follows.

Surprisingly, it has been discovered that the aforesaid objectives may be achieved by a process and composition which render the colloidal composition more resistant to oxidation and hence provide a greater catalytic activity for the colloid when adsorbed onto the non-conductors, and in particular in a one stage activation treatment prior to the electroless plating step.

DETAILED DESCRIPTION OF THE INVENTION

The process of the present invention is applicable to metallic plating of a wide variety of dielectric (non-conductor) substrates. Dielectric substrates described in the prior art, including thermoplastic and thermosetting resins and glass, may also be suitably plated in accordance with the present invention. Normally, these substrates will be cleaned and surface treated prior to plating in order to improve adherenence of the metallic coating. The present invention is an improvement to the processes and composition disclosed above (references of page 2) and which are included herein by reference.

The colloids of the present invention are generally prepared by adding the selected compound of a catalytic metal or a salt thereof, e.g., the sulfate, nitrate, or acetate salt, to an aqueous medium to produce an aqueous solution reacting the above solution with a chemical agent which will yield by precipitation either a reduced metal, compound or an alloy of said metal. The precipitation reaction is generally carried forth in the presence of at least one colloid stabilizer thereby stabilizing the resulting colloid formed and insuring good dispersion for the medium and minimizing particle size growth. The metal selected is of a catalytic nature in the initiation of the electroless plating process in at least one of its oxidation states.

Although there are various methods for the production of colloids in U.S. Pat. No. 2,438,230, such approaches, while simple to implement, do not provide as great a freedom with respect to selectivity of colloids formed and their properties as those produced by the precipitation technique. U.S. Pat. No. 3,635,668 describes a process for the production of copper hydrate suitable for use as a fungicide. U.S. Pat. No. 3,082,103 demonstrates a universal milling technique by which finely divided oxides may be formed. It should also be noted that while most of the examples in the present invention are directed to formation of the colloidal solutions via precipitation technique, the present invention is not limited to this approach. Specifically, catalytic colloidal composition may also be prepared by the dispersion and stabilization of properly prepared powders containing the active ingredient(s). Hence, the manner by which the chemical components are used in preparing said colloidal catalytic composition is a matter of convenience, e.g., shipping costs. The precipitation technique in producing the catalytic medium is believed however to possess certain advantages. Specifically, this technique is potentially capable of producing colloids of varied size, shape, and chemical make-up. This freedom is especially useful with respect to desired subsequent catalytic properties. Furthermore, such technique is also useful in the preparation of reduced metal or metal-alloys or compounds by adding a suitable precipitating agent (e.g., reducing agent) which can form the reduced metallic state or the alloys or the resulting compound(s) through its chemical interaction with the metal ions. Typical reducing agents are hydrazine, tannic acid, amineboranes, hypophosphites, borohydrides, sulfur types, etc. In the event that the colloids are prepared by a precipitation technique it may further be recommended that, after centrifugation, washing and redispersion in pure water be undertaken thereby removing extraneous ionic species and insuring a medium with low ionic strength. In use, it is also recommended that mild agitation (mechanical, gas dispersion or thermal) be applied to the solution composed of the colloidal particles. It is recognized that for storage and/or shipping the resulting colloids must show good stability. Accordingly, it is highly desirable to use preparation conditions in which highly stable colloids result.

The stability of the above colloidal compositions may be enhanced by various techniques, e.g., dialysis, repetitive centrifugation and washings, as well as by the addition of various materials, referred to herein as stabilizers. The term "stabilizer" is used herein to generally describe chemicals believed to be adsorbed onto the colloids thereby altering the charge characteristics of said colloids and thus preventing their coagulation. Such stabilizers may be of either organic or inorganic nature and combination thereof.

Stabilizers contemplated by the present invention include secondary colloids, polyalcohols, sugars, dispersants and surfactants, which while by themselves do not serve to catalyze the dielectric substrate in this process, are believed to stabilize the active colloid by an encapsulation (or adsorption) mechanism. It is noted that for a specific composition more than one stabilizer may be present. Stabilizers may also be chemicals which take part within the colloidal double layer structure.

Typical secondary colloids are gum arabic, gelatin, agar agar, starch, albumin, hemoglobin, cellulose derivatives such as carboxymethyl cellulose and hydroxypropyl cellulose, N-alkylbeta-aminopropionic acid, carboxymethyl dextran, and the like. Typical sugars include mannitol, sorbitol, dulcitol maltose, and arbinose raffinose.

Surfactants and/or dispersants may also be suitably employed as stabilizers for the colloids contemplated by the present invention. The "surfactant", or "surface active agent", as used herein generally refers to substances which are capable of lowering the surface tension of a liquid or the interfacial tension between two liquids. All such substances possess the common feature of a water-soluble (hydrophilic) group attached to an organic (hydrophobic) chain. Surfactants as used herein are also intended to encompass detergents, dispersants and emulsifying agents regardless of whether they are or are not capable of lowering the interfacial surface tension. The surfactants used are not limited to the hydrocarbon type and they can be fluorocarbon or silicon bearing type.

It is also contemplated that a mixture of surfactants or surfactants with other stabilizers may be used. Care should be exercised (e.g., excess concentration) in the use of surfactants in the preparation of the present colloids, as would be obvious to one skilled in the art.

The term "antioxidant" as used herein is generally intended to encompass chemical compounds which are mild reducing agents. These reducing agents, however, are not capable of reducing the metallic ions to the elemental state (e.g., $Ni^{+2}$ or $Ni^0$). These reducing agents may or may not be colloid stabilizers. Typical antioxidants may be selected from compounds such as, but not limited to, alcohols, polyalcohols, hydroquinone, phenol, resorcinol, BHT, sugars, aldehydes, pyrogallol, cresol, BHA, sulfite, etc.

The term "precipitation agent" as used herein is generally intended to encompass those chemical compounds which when contacted with metallic ions (with or without added energy) cause the onset of the secondary phase (insoluble colloidal phase). Typical materials may be reducing agents, hydroxides, sulphides and others. At times, depending on the chemical nature of the precipitation agents, codeposits within the resulting colloids are formed.

The term "adsorption modifier" as used herein is intended to encompass chemicals which, when used with the non-conductor substances prior to the non-precious colloidal catalytic composition, provide an increased adsorption or absorption of the catalytic component(s) present within the colloidal composition onto the substrate. Typical chemicals are surfactants, hydrous oxide sols, as well as strong complexing (chelating) agents. In the selection of the adsorption modifier, one skilled in the art should consider first the etch step preceding (i.e., $CuCl_2/HCl$, $CrO_3/H_2SO_4$ or persulfate, etc.) and note first its effect upon the catalyst adsorption. In addition, in using the adsorption modifier as a distinct step, good water rinsing is recommended to insure the removal of any excess from the non-conductor surface.

In general, it is believed that the use of the adsorption modifier changes the net charge of the surface and/or provides chemical bonds (linking sites) for the subsequent adsorption (or absorption) of the active colloidal matter. Though the use of the adsorption modifier may be included within the colloidal composition it is preferable to use such step as a prewet so as to insure the maintenance of a low ionic strength for the colloidal composition and hence its ultimate stability and reactivity.

In general, the electroless coating process of the present invention comprises the following sequence of steps followed by electroless plating.

1. Etching the substrate followed by rinsing.
2. Contacting the substrate with a composition comprising the adsorption modifier thereby improving the subsequent adsorption and/or absorption for the colloid(s) within the colloidal catalytic composition and rinsing.
3. Immersing a dielectric substrate into a composition comprised of a colloid of a non-precious metal, preferably selected from the group consisting of copper, nickel, cobalt, and iron, and mixtures thereof, and wherein the metal is either in the reduced state (elemental) or part of an alloy (e.g., phosphide, boride, sulfide, nickel-copper, etc.) or compound and rinsing the substrate with water to remove excess colloid.
4. Immersing of the treated substrate into a compatible electroless plating bath for the metallic build-up In an alternate embodiment it may be necessary to provide an activation step prior to the electroless step but after the colloidal step. Such step may include a composition containing a reducing agent which reduces the induction time in the electroless step or a stripping (etching) composition capable of attacking a portion of the colloid adsorbed onto the substrate (e.g., colloid stabilizer), or selective dissolution of the colloids from regions of poor adsorption or absorbtion.

The following examples are illustrative of the present invention and are not to be taken in limitation thereof.

EXAMPLE I

As ABS substrate was etched in a solution comprised of 400 g/l chromium oxide and 350 g/l concentrated sulfuric acid for several minutes at a temperature of 70° C. Thereafter, the etched substrate was immersed in a primer solution for five minutes, the primer (colloidal) composition being prepared by dissolving one gram of $NiCl_2.6H_2O$ in 100 milliliters of deionized water and raising the pH to 6.5 with the slow addition of one molar NaOH. The primed substrate was then rinsed and immersed in a reducing composition (developer) comprised of one g/l of $KBH_4$ for two minutes. The substrate was then rinsed and immersed in an electroless copper bath at a temperature of 40° C. having the following composition to effect plating:

| | |
|---|---|
| $CuSO_4 . 5H_2O$ | 15 g/l |
| EDTA (40%) | 68 cc/l |
| NaOH | 9 g/l |
| NaCN | 3 ppm |
| Terigitol TMN | 0.2 (wt. %) |
| $H_2(37\%)$ | 22 cc/l |

Substitution of other metallic compounds of catalytic metals for the nickel chloride should be obvious.

EXAMPLE II

A hydrous oxide colloid was prepared by adding five milliliters of 0.05 molar ammonium hydroxide to 20 milliliters of 0.25 molar copper acetate with good mixing. This colloid, when substituted for the colloid employed in Example I herein above, produced good electroless plating.

EXAMPLE III

An ABS substrate was prepared using the primer solution of Example II of U.S. Pat. No. 3,993,799 developed with the developer solution of Example I herein above. An electroless nickel plating was formed by immersion of the substrate at a temperature of 60° C. in an aqueous bath having the following composition:

| | |
|---|---|
| $NiSO_4 . 6H_2O$ | 25 g/l |
| $Na_4P_2O_7 . 10H_2O$ | 50 g/l |
| $NH_4OH$ (conc.) | 15 cc/l |
| Dimethylamine borane | 4 g/l |

EXAMPLE IV

One gram of $CoCl_2.6H_2O$ was dissolved in 100 ml of deionized water to which 0.5 ml of one molar NaOH was added. The suspension thus formed was heated for 24 hours at 65° C. and then additionally aged at room temperature for six days before usage. Similar colloids were formed with 1.0 ml and 2.0 ml of NaOH being used.

EXAMPLE V

ABS substrates were immersed in the colloids of Example IV for five minutes at room temperature followed by rinsing and immersion in a developer solution containing 1 g/l $KBH_4$ at pH 8.5 for 2 to 5 minutes to reduce the cobalt or nickel to a lower oxidation state. Subsequent immersion of the plaques into an electroless copper bath at 40° C. produced plating.

EXAMPLE VI

An ABS substrate was immersed in a colloidal solution formed by adding to 1600 ml of 0.0125 molar copper acetate solution, 400 ml of 0.025 molar $NH_4OH$ dropwise with stirring of the solution. The substrate was thereafter developed and plated in the manner described in Example V with good results. Successful results were also achieved using a developer solution containing only 0.1 g/l $KBH_4$.

EXAMPLE VII

ABS substrates prepared in accordance with Example VI were successfully plated utilizing the following electroless nickel bath at pH 6 and a temperature of 25° C.:

| | |
|---|---|
| $Ni^{++}$ (from a sulfamate concentrate | 8.0 g/l |
| Dimethylamine borane | 5.0 g/l |

EXAMPLE VIII

ABS substrates prepared in accordance with Example VI were also successfully plated utilizing the following electroless cobalt bath at pH 7.6 and a temperature of 50° C.:

| | |
|---|---|
| $CoSO_4 . 7H_2O$ | 25 g/l |
| Disodium succinate . $6H_2O$ | 25 g/l |
| Dimethylamine borane | 4 g/l |

EXAMPLE IX

The ABS substrate of Example VI was also successfully treated using the following developer solutions:
1. Borane-tertbutylamine complex (2 g/l) at 25° C. and 40° C. with immersion time of 5 minutes.
2. Borane morphine complex (2 g/l) at 25° C. and 40° C. with immersion time of 5 minutes.
3. Dimethylamine borane (2 g/l and pH 11 adjusted with NaOH) at 40° C. and immersion time of 5 minutes.

EXAMPLE X

Four hundred ml of 0.025 molar $NH_4OH$ was added dropwise with stirring to 1600 ml of 0.0125 molar copper acetate to form a colloidal primer solution from which other solutions were prepared and evaluated. The nature of certain surfactants added is shown in parentheses. The process of evaluation consisted of ABS treatment in colloidal primer, developer at room temperature with a 1 g/l solution of $KBH_4$ and coating with colloidal copper at 40° C. The following results were obtained:

| Solution | Additive | Conc. | Plating Evaluation after 5 days from a Preparation of Control |
|---|---|---|---|
| 1 | NaCl | .01 M | positive |
| 2 | NaCOOH | .01 M | positive |
| 3 | Tartaric Acid | .01 M | positive |
| 4 | Sucrose | .01 M | positive |
| 5 | Sodium Lauryl Sulfate (anionic | .01 M | negative |
| 6 | K . Na tartrate | .01 M | positive |
| 7 | Na citrate | .001 M | negative |
| 8 | union Carbide Tergitol 15-S-3 (nonionic) | 2 ml/l | positive |
| 9 | DuPont Zonyl FSC (cationic) | 2 ml/l | negative |
| 10 | Union Carbide - TMN surfactant (nonionic) | 2 ml/l | positive |
| 11 | Zonyl FSA (anionic) | 2 ml/l | positive |
| 12 | Zonyl FSB (amphoteric) | 2 ml/l | negative |
| 13 | Zonyl FSN (nonionic) | 2 ml/l | positive |
| 14 | Zonyl FSP (anionic) | 2 ml/l | positive |
| 15 | 3M FC 170 (nonionic) | 2 ml/l | positive |
| 16 | 3M FC 176 (nonionic) | 2 ml/l | positive |
| 17 | none (control) | — | positive |
| 18 | control diluted 10 × | — | positive |

It should be noted that the surfactants used in solutions 9 and 11-16 are all composed of fluorocarbon chains rather than hydrocarbon chains. Such surfactants have shown good chemical stability and wetting in a wide variety of chemical environments.

EXAMPLE XI

The control solution of Example X was also employed in coating of ABS substrates with the exception that the developer solution was diluted from 1 g/l to 0.1 g/l. Successful initiation of electroless plating was noted.

EXAMPLE XII

The control solution of example X was used in coating ABS substrates. The alkalinity of the electroless copper solution was varied, however, from 0.089 to 0.402 molar by the addition of sodium hydroxide. Improvement in the plating uniformity was noted as the alkalinity was increased, probably due to the increased reactivity of the electroless formulation.

EXAMPLE XIII

The procedure of Example X was followed with the exception that the following electroless copper formulation was used at 50° C.:

| | |
|---|---|
| $CuSO_4 . 5H_2O$ | 10 g/l |
| NaOH | 10 g/l |
| Sodium potassium tartrate . $4H_2O$ | 50 g/l |
| HCHO (37%) | 22 cc/l |

EXAMPLE XIV

Since surfactants are conventionally employed in electroless processes, the following surfactants were added to a 0.05% developer solution of potassium borohydride: Union Carbide Tergitol TMN and 15-S-3;

DuPont Zonyl FSA, FSC and FSN; 3M FC-98, FC-128, FC-170, FC-134, and FC-176 in a concentration range of few mg/l of developer solution. No major improvement in plating uniformity was noted.

EXAMPLE XV

The following colloidal products were prepared by first dissolving 1 gram of $NiCl_2.6H_2O$ in 100 ml DI water. In each case, a varied volume of 0.1 M NaOH was added slowly with agitation.

| Case No. | Volume of NaOH added (ml) | Final pH |
|---|---|---|
| 1 | 0.4 | 6.6 |
| 2 | 1.0 | 7.0 |
| 3 | 2.0 | 7.2 |
| 4 | 5.0 | 7.3 |
| 5 | 10.0 | 7.4 |

These products were sealed and immersed at 65° C. for 48 hours. Evaluation of the colloidal products was undertaken following 48 hours at 65° C. and 3 days of storage at room temperature. The procedure used to evaluate was using standard ABS substrate, immersion in colloidal product (10 minutes) rinse, immersion in developer ($KBH_4$ 1 g/l for 5 minutes), rinse, and electroless plating. Using the electroless copper at 40° C., induction time was slow and coverage was incomplete. Using an electroless nickel of the following composition at 45° C., results showed improved coverage and a shorter induction time in comparison to the case of copper.

| | |
|---|---|
| $Na^{++}$ (from a sulfamate conc.) | 8 g/l |
| DMAB | 5 g/l |
| pH | 5.3 |

The difference in the behavior between nickel and copper is probably due to the fact that in the case of copper the plating process is first dependent upon the successful galvanic reaction between the copper ions in solution and the reduced nickel on the surface.

EXAMPLE XVI

A copper colloid which initiated plating directly was prepared according to a procedure suggested by Weiser, "Inorganic Colloid Chemistry", Vol. 1, p. 137. In this preparation, 40 ml of 0.01 M $CuSO_4$ was heated to 80° C. 10 ml of 0.5% $H_3PO_2$ was added with stirring. Etched ABS substrates were immersed in the resulting colloid for 10 minutes, rinsed, and directly immersed into the electroless copper solution of Example I at 45° C. Plating was noted to take place. Substitution of other catalytic metals for the $CuSO_4$, e.g., nickel sulfate, is anticipated to yield some alloy of nickel phosphide and metallic nickel.

EXAMPLE XVII

A colloidal nickel product was prepared as follows: 25 ml of 0.005 M solution of potassium borohydride was added to a solution composed of 30 ml of 0.0025 M nickel acetate and 0.1 ml of CF-54 surfactant (product of Rohm & Haas). After immersion of the test substrate in the above priming solution, it was found useful to activate the surface by further immersion in a reducing agent solution (e.g., 1 g/l $KBH_4$). Immersion in the electroless copper bath resulted in good initiation and coverage. Substitution of other catalytic metals for nickel and/or mixtures thereof should be obvious upon reading this invention. Moreover, it is recognized that other reducing agent(s) may be used to yield the colloidal metal(s), compound(s), and alloy(s) all bearing the catalytic metal(s). The essential requirement for a reducing agent is to reduce homogeneously the metallic compound bearing the catalytic metal.

EXAMPLE XVIII

Colloidal catalytic hydrous oxides of copper and nickel were prepared by aging (18 hours at 75° C.) solutions composed of $9 \times 10^{-4}$ M $NiSO_4$, $1 \times 10^{-4}$ M $CuSO_4$, $2 \times 10^{-3}$ M NaOH and $4 \times 10^{-3}$ M of the cationic surfactant of Example XXV of U.S. Pat. No. 3,993,799 with a final pH of 4.4. Using the above binary colloidal composition at 40° C. and a developer solution (1.5 g/l $KBH_4$, 5 minutes) with a commercial electroless copper bath (Sel-Rex Oxytron Cu #990) at 31° C. gave good plating results; however, using the single colloids under the same conditions did not produce as good quality plating coverage. It was also found that due to the apparent greater activity of the catalytic surface, reduced concentrations of developer solutions can be used in conjunction with the electroless copper of Example I. It is recognized that cobalt or iron may be substituted for nickel since they have a similar electronic structure. Based upon these results these resuls it is recognized that it is the catalytic surface composed of copper and nickel which offers a greater catalytic activity. In addition, it is also recognized that a mixed catalytic surface (i.e., copper and nickel, or copper and cobalt) may be derived from other mixed dispersions (metals, alloys and compounds). These catalytic metals when adsorbed enhance the catalytic activity of the surface. The actual concentration for each of the mixed metals is best determined by simple trial experimentation.

EXAMPLE XIX

Ferric and chromium hydrous oxide colloids were prepared by aging at 75° C. for 18 hours the following compositions $1 \times 10^{-3}$ M $FeCl_3$, $2 \times 10^{-3}$ M NaOH, and $4 \times 10^{-3}$ M of the cationic surfactant of Example XXV of U.S. Pat. No. 3,993,799 with a final pH of 10.5; and $1 \times 10^{-3}$ M $Cr(NO_3)_3$, $2 \times 10^{31\ 3}$ M NaOH, and $4 \times 10^{-3}$ M surfactant with a final pH of 4.2. These primer solutions used at 40° C. with 1.5 g/l $KBH_4$ and electroless copper bath (of Example I) at 40° C. showed some evidence of plating on ABS substrate, and it should be recognized that increasing the developer concentration, or the colloid concentration, or both, could also bring the conditions for plating to an optimum.

In the primer solution the ferric and chromium ions are adsorbed onto the substrate and then reduced to the zero oxidation state when immersed in the developer solution. After the developer solution, the substrate is immersed in the electroless copper bath. It is believed in this solution a replacement mechanism occurs in which the copper replaces the iron (or chromium) on the substrate (e.g., $Cu^{+2} + Fe^0 \rightarrow Cu^0$) after which electroless initiation about the copper ($Cu^0$) sites takes place. It is this replacement reaction which has been illustrated herein the previous example. It should be noted that this is only an example of the initiation mechanism and that any metal which will work for this mechanism falls within the contemplation of the present invention. Such metals are those having a more negative reduction potential than copper. Typical metals which fall into this category for use with electroless copper baths are iron, zinc, and chromium.

EXAMPLE XX

Effective hydrous oxide copper colloidal reaction products were prepared replacing sodium lauryl sulfate stabilizer of Example XXX of U.S. Pat. No. 3,993,799 with the addition singly of the following additives:

| Gum Arabic | 4 mg/l |
|---|---|
| Ethylene Glycol | 25 ml/l |
| Polyethylene Glycol (M.W. average 1000) | 0.025 molar |
| Tannic Acid | $5 \times 10^{-3}$ molar |
| Glycerol | 25 ml/l |

It is noted that some of the additives used are reducing agents which may act as antioxidant or precipitating agent.

In the practice of the present invention, an increase in the reactivity of the colloid has been found to permit a decrease in the reactivity of the reducing containing solutions. The latter may be modified by changes in the concentration of the reducing agent used and/or changing the nature of the agent used which may be part of the electroless bath. Methods for increasing colloidal reactivity may include concentration, temperature, particle size and charge modification, and the adsorption modifier. The ability to use reducing solutions of lower reactivity is a significant cost savings and means for the use of less expensive reducing agents and/or electroless plating baths of greater stability.

The present invention is also effective in the formation of selective deposition on dielectric substrates, by selectively depositing or by the selective masking of such colloids.

In following the teachings disclosed in U.S. Pat. No. 3,958,048 which is included herein by reference, colloidal dispersions according to examples (VII and VIII of U.S. Pat. No. 3,958,048) were prepared since they represented the best results. The resulting suspensions were tested in accordance with the process steps described in U.S. Pat. No. 3,958,048 using an alkaline electroless copper bath with formaldehyde as the reducing agent. Only the resulting suspension (dispersion) of example VIII (U.S. Pat. No. 3,958,048) yielded significant plating.

Within a few hours, using the prepared catalytic suspension(s), plating results deteriorated drastically. However, a more interesting observation is that neither of the prepared suspensions was stable. Specifically, it was observed that within about 24 hours of preparation the colloidal nature of the suspensions was destroyed, yielding a true solution or the formation of two distinct phases. In either case, it should be obvious that such unstable suspensions are not useful for commercial application.

However, these impractical compositions can be made useful, specifically in providing methods by which long term stability may be achieved. In the first method, energy (e.g., thermal) was added to one of the major reactants so that the precipitation reaction is carried forth above room temperature similarly to the heating described above. Repeating example VII of U.S. Pat. No. 3,958,048, the solution comprised of the inorganic salt(s), dispersant(s), and/or colloid stabilizer(s), was preheated to about 55° C. and then allowed to react with the precipitating agent (e.g., alkaline sodium borohydride). Results using this method clearly showed increased colloidal stability and simultaneously maintained the plating performance. While only one reactant was heated, it should be recognized that the method is applicable to either reactant, or both. Furthermore, for each system, a range of preferred temperatures is recognized; the value (or range) can be determined by simple experimentation by one skilled in the art using the present teachings.

Accordingly, it should be recognized that the present method in which external energy is supplied to the reaction (formation of the colloid) is extremely useful to the present process and composition. Furthermore, based upon these findings, the resulting colloids may be metallic, alloys, or compounds bearing metals which are catalytic for the electroless plating initiation. In addition, it should be recognized that any of several colloid stabilizers may be present during the precipitation reaction. Further, the end product formed (colloidal adduct) varies depending upon the nature of the precipitating agent and the metal ions present. The end product(s) may be metals, alloys, hydrous oxide, compounds, and combinations thereof.

In the second method for improved stabilization the following composition was utilized:

| $CuSO_4 \cdot 5H_2O$ | 9.96 g/l |
|---|---|
| $CoCl_2 \cdot 6H_2O$ | 2.38 g/l |
| Sodium lignosulfonate* | 12 g/l |
| $NaBH_4$ | 0.76 g/l |
| NaOH | variable |

*with some reducing sugars present

This admixture of chemicals was allowed to react with the end product of varied pH. End product pH values were in the range of about 6.5 to about 12.6. It is interesting to note that the resulting suspension(s) showed a major improvement in stability at higher pH values of about 9.5. In addition, it was found that prior to usage those suspensions having a higher pH value may be adjusted in pH (lowering) thereby becoming more effective in the plating process.

Accordingly, it should be recognized that the initial pH value for the prepared colloids is a significant parameter reflecting the properties and the general stability of the resulting colloids. However, caution must be exercised in using over excessive pH values since hydroxyl ions may form soluble complexes with certain transition metal ions and destroy the colloidal nature of the suspension(s). While in this example sodium lignosulfonate was used as the stabilizer (dispersant), it is recognized that other suspending agents and stabilizers (e.g., derivatives of alkyl naphthalene, sulfonic acids, substituted benzoid alkyl sulfonic acids, and many others) can be substituted and employed in the method described. Further, while in this illustration sodium borohydride was selected as the precipitating agent, substitution of other precipitating agents should be obvious and their incorporation falls within the spirit of the present invention. It has been observed that the combination of copper and cobalt, or copper and nickel, provides a greater catalytic activity and, to a lesser extent, a combination of copper and iron.

It should be noted that the present process is useful particularly since some of the colloidal compositions are operative at pH values close to the neutral point. It is well recognized that compositions having neutral pH values are more easily handled and further alleviate certain waste disposal practices.

The following examples are provided to demonstrate the application of a prewet or adsorption modifier as applied to printed circuitry through-hole metallization. It is essential to provide with "void-free" within the through-holes.

The incorporation of the adsorption modifier is believed to alter the effective charge for the non-conductor substrate which may have been previously etched. This alteration in the interfacial charge can lead to more favorable conditions for the subsequent adsorption (or absorption) of the colloidal catalyst. In addition, the use of the adsorption modifier may lead to the retention of new chemical functional groups which later may interact with the colloidal catalyst in a manner whereby increased adsorption site density has taken place. Depending upon the adsorption modifier used, carboxylate, amine hydroxyl, aromatic and other ionic groups may be present at the interface, assisting in the later adsorption of the colloid(s).

EXAMPLE XXI

Copper laminates with through-holes were processed utilizing a primer composition comprising

| | |
|---|---|
| $SnCl_2 \cdot 2H_2O$ | 30 g/l |
| CuCl | 2.3 g/l |
| HCl | 100 cc/l |
| Cresol | 10 g/l | followed by a developer composition

| | |
|---|---|
| DMAB | 2 g/l |
| pH | 9 | and electroless copper bath at 110° F. to 130° F. Prior to the primer composition the laminate board(s) were soaked, cleaned, and etched in $CuCl_2$/HCl etchant. Plating results revealed incomplete metallic coverage; however, incorporation of either NWS cationic surfactant or a T G-88 surfactant into the primer composition has significantly improved the through-hole metallization results to yield complete metallization. Though in this work the surfactants (adsorption modifier) were incorporated within the primer composition, based upon the teaching of U.S. Pat. Nos. 3,993,491 and 3,993,848, especially for the colloidal composition, it is preferable to use the modifier prior to the primer or the colloidal catalytic composition step. This preference stems from the possibility of destruction in the stability and/or reactivity for the colloidal product.

EXAMPLE XXII

Wetting solutions of surfactants Aerosol OT, FC-95, FC-134 and FC-431 were used on etched ABS prior to the colloidal catalytic composition. It is noted that the FC series are commercial fluorocarbon surfactants available through the 3M Company. In all cases, the subsequent adsorption of the colloidal product was improved (noted visually). In the case of Aerosol OT, a Cu/Sn colloid from Example I of Ser. No. 938,890 was used which was stabilized with gelatin. In the case of the FC surfactants, copper colloids stabilized with gum arabic were used and the colloids were prepared by the nucleation reaction with $NaBH_4$.

EXAMPLE XXIII

A copper laminate with through-holes was used after a few minutes etching in a persulfate solution. The following steps were carried forth with intermediate rinsing.
i. immersing into an aged tin(IV) composition (hydrous oxide sol)
ii. immersion into a copper colloid product of reduction with $NaBH_4$
iii. 0.5 g/l DMAB, and
iv. room temperature electroless copper.

Results utilizing the prewet solution gave excellent coverage within the through-holes in comparison to the same process without the prewet.

Summarizing the results of the above illustrations, it is recognized that novel methods are available whereby improved stable dispersions useful in the preparation of colloidal catalytic compositions for non-conductive substrates prior to electroless metal deposition can be made.

It is also noted that in some of the above examples as well as some of the listed stabilizers, reference to amphoteric materials has been made. The incorporation of amphoteric stabilizers is extremely novel and useful in providing universal catalytic dispersions for a multiplicity of substrates having varied plurality of surface charge. Specifically, since amphoteric stabilizers may be both negatively and positively charged with varied pH, the resulting catalytic dispersion may also be varied in the same manner. In fact, one skilled in the art may prepare one dispersion of a specific charge (utilizing an amphoteric product) and reverse the initial charge through a simple and rapid pH adjustment. Again, this novel feature is not limited to any specific colloid (i.e., metal colloid nucleus vs. alloy vs. compound) or the steps used after the adsorption of the colloid on the substrate.

It should also be obvious that various approaches may be taken in the charging of such colloids, e.g., controlled addition of compound with specific anions such as hydroxyl ions and/or controlled addition of suitable surfactants and/or secondary colloids. In addition, the reference to catalytic metal is intended to encompass various colloidal end-products (e.g., metals, alloys, oxides and compounds) bearing the catalytic metal(s) in any of several oxidation states which are non-noble.

It will further be obvious to one skilled in the pertinent art that many modifications and variations may be made in the preceding description without departing from the spirit and scope of the present invention. For example, it will be apparent that mixtures of reducing agents may be used in a single solution or may be used in successive steps. Furthermore, it is within the scope of the present invention to delete the use of a separate reducing solution and directly immerse the substrate (contacted previously with the colloidal catalytic composition) in a compatible electroless plating formulation containing one or more reducing agents.

As described above by way of examples, remarks, and cited references, a wide variety of chemical compounds may be selected as the precipitating agent(s). I have further found that certain precipitating agents (e.g., hydride derivatives such as sodium borohydride, dimethylamine borane and related ones) through their interaction with the catalytic metal ions yield finely divided colloids (black in appearance) which change in their appearance with time with noted detrimental effects upon the plating results. While I do not wish to be bonded by theory, it appears that in the course of the colloidal formation, by-product(s) are also formed (e.g., $BH_4^-$ to $BO_2^-$) and it is the presence of such ionic by-product which, with time, is believed to react with the colloidal nucleus and cause the noted deterimental change. Accordingly, in selecting a precipitating agent, it is preferred to select a precipitating agent the by-product(s) of which would not react and destroy the initial colloid(s) formed. Hydrazine and its derivatives is an example of one such class of precipitating agents whose by-products (nitrogen and hydrogen) do not accumulate along with the main desired reaction product(s) during the precipitating reaction.

Accordingly, I have recognized that the preferred precipitating agent(s) should be selected of such chemical nature which either will yield essentially no by-products accumulating to any degree with the colloid reaction by-product and which is detrimental to said colloidal nucleus, or those agents whose by-product(s) can stabilize said colloidal nucleus or be more inert in the resulting medium (e.g., $S_2O_4^{-2}$ and related compounds).

It should also be recognized by those skilled in the art that, from the present teachings, multiple combinations of materials shown in separate examples are possible and such combinations fall within the spirit of the invention.

I have further recognized that undesired by-products stemming from the precipitating agent(s) may be deactivated through their removal by any of several separation techniques (e.g., ion exchange, precipitations, dialysis, etc) thereby removing their detrimental effect(s) on the produced colloids. Alternatively, a chemical agent may be incorporated which selectively would react with the formed by-products. One such example is the incorporation of magnesium or calcium ions with the $BO_2^-$ formed from various hydrides.

Also it is recognized that the incorporation of the adsorption modifier as a distinct step is almost essential for a colloidal catalytic composition as to insure no perturbation for the colloid stability and reactivity.

I claim:

1. A process for the metallization of an etched nonconductor substrate by electroless or chemical plating comprising;
   a. contacting said substrate with a composition comprising of an adsorption modifier said modifier being a complexing agent and wherein the retention of said adsorption modifier on said substrate provides a path for an increased catalytic site density of the colloidal catalytic product,
   b. contacting said substrate with a colloidal catalytic composition, said composition comprising of non-precious metal which directly or serving as a precursor leads to the catalytic sites which are capable of electroless plating initiation and wherein said metal may be in either elemental state, an alloy, or a compound and mixtures thereof, and
   c. contacting said substrate with a compatible electroless plating bath.

2. The process according to claim 1 wherein said metal is copper.

3. The process according to claim 2 wherein said copper is part of an alloy.

4. The process according to claim 2 wherein said copper is part of a compound.

5. The process according to claim 2 wherein said copper is in the elemental state.

6. The process according to claim 1 wherein said colloidal catalytic composition is near the neutral pH value.

7. The process according to claim 1 further containing the step of activation and wherein said step of activation takes place prior to the step of electroless plating however after the step of contacting the substrate with the colloidal catalytic composition.

8. The process according to claim 1 further containing the step of etching and wherein said step of etching takes place prior to the step comprising the adsorption modifier.

9. The process according to claim 1 wherein said step of electroless plating is of copper.

10. The process according to claim 1 wherein said substrate is a copper laminate with through-holes.

11. The process according to claim 1 wherein said colloidal catalytic composition is prepared by a precipitation technique.

12. The process according to claim 1 wherein said colloidal catalytic composition further comprises an antioxidant capable of retarding the oxidation of the non-precious metal.

13. The process according to claim 1 wherein said colloidal catalytic composition is in an aqueous medium.

14. The process according to claim 1 wherein said substrate is ABS.

15. The process according to claim 1 wherein said colloidal catalytic composition is prepared by the nucleation of the colloid via the reduction of non-precious metal ions.

16. The process according to claim 1 further containing the step of water rinsing to remove excess adsorption modifier.

17. The process according to claim 1 wherein said adsorption modifier is in an aqueous medium.

18. The process according to claim 1 wherein said complexing agent is a chelating agent.

19. The process according to claim 1 wherein said colloidal catalytic composition further contains an antioxidant.

20. A process for the metallization of a printed-circuitry substrate by electroless or chemical plating comprising the steps of
   a. contacting said substrate with a composition comprising of an adsorption modifier said modifier being a complexing agent wherein the retention of said adsorption modifier on said substrate provides a path for an increased catalytic site density of the colloidal catalytic product,
   b. contacting said substrate with a colloidal catalytic composition, said composition comprising of non-precious metal which directly or serving as a precursor leads to the catalytic sites which are capable of electroless plating initiation and wherein said metal may be in either elemental state, an alloy, or a compound and mixtures thereof, and
   c. contacting said substrate with a compatible electroless plating bath.

21. The process according to claim 20 wherein said metal ion is copper.

22. The process according to claim 20 wherein said copper is part of an alloy.

23. The process according to claim 20 wherein said substrate contains through-holes.

24. The process according to claim 20 further containing the step of water rinsing said rinsing taking place after the contacting of said substrate with said adsorption modifier and thereby removing excess adsorption modifier from said substrate.

25. The process according to claim 20 wherein said electroless plating bath is copper.

26. The process according to claim 20 wherein said colloidal composition contains an antioxidant.

27. The process according to claim 20 further containing the step of activation, said activation taking place subsequent to the contacting of the substrate with the colloidal catalytic composition, however prior to the step of electroless plating.

* * * * *